United States Patent [19]

Iaccino et al.

[11] Patent Number: 5,226,362
[45] Date of Patent: Jul. 13, 1993

[54] PALLET ALIGNMENT ASSEMBLY

[75] Inventors: Alex Iaccino, Mount Prospect; Phil Motev, Deerfield; Rick L. Fuqua, Chicago, all of Ill.

[73] Assignee: American Screen Printing Equipment Company, Chicago, Ill.

[21] Appl. No.: 819,083

[22] Filed: Jan. 9, 1992

Related U.S. Application Data

[63] Continuation-in-part of Ser. No. 770,518, Oct. 3, 1991, Pat. No. 5,188,026, and a continuation-in-part of Ser. No. 746,652, Apr. 16, 1991.

[51] Int. Cl.[5] .............................................. B41M 1/12
[52] U.S. Cl. .................................... 101/129; 101/126; 101/127
[58] Field of Search ..... 101/115, 123, 126, 127-127.1, 101/129; 198/345.1

[56] References Cited

U.S. PATENT DOCUMENTS

| | | | |
|---|---|---|---|
| 3,977,322 | 9/1976 | Jaffa | 101/126 |
| 4,031,825 | 6/1977 | Jaffa | 101/126 |
| 4,287,826 | 9/1981 | Brabec | 101/115 |
| 4,315,461 | 2/1982 | Harpold | 101/115 |
| 4,407,195 | 10/1983 | Jaffa | 101/126 |
| 4,463,673 | 8/1984 | Moore | 101/126 |
| 4,583,458 | 4/1986 | Beachum | 101/115 |
| 4,649,815 | 3/1987 | Richardson | 101/126 |
| 4,669,378 | 6/1987 | Lee | 101/126 |
| 4,723,487 | 2/1988 | Richardson | 101/126 |
| 4,735,139 | 4/1988 | Szarka | 101/126 |
| 4,738,909 | 4/1988 | Jennings | 430/22 |
| 4,819,559 | 4/1989 | Szarka | 101/474 |
| 4,846,058 | 7/1989 | Farris | 101/126 |
| 4,909,142 | 3/1990 | Bubley | 101/115 |
| 4,909,146 | 3/1990 | Szarka | 101/126 |
| 4,920,878 | 5/1990 | Harpold | 101/115 |
| 4,939,991 | 7/1990 | Szarka | 101/115 |
| 4,974,508 | 12/1990 | Andersen et al. | 101/115 |
| 5,020,430 | 6/1991 | Harpold et al. | 101/126 |
| 5,090,313 | 2/1992 | Chapman | 101/129 |

*Primary Examiner*—Eugene H. Eickholt
*Attorney, Agent, or Firm*—Fitch, Even, Tabin & Flannery

[57] ABSTRACT

Disclosed is a pallet aligning system which allows a pallet to be mounted to a pallet support arm in a desired orientation and lateral spacing with respect to the support arm and thereafter be removed and remounted to the support arm in the previously defined orientation and lateral spacing, thereby precluding the need to reposition the pallet upon each subsequent reattachment thereof to a pallet support arm. This pallet alignment system is particularly useful when combined with a screen alignment system to re-establish registration of the screens as well as the pallets used therewith. Lateral restraining members are mounted to the underside of the pallet for selective laterally movement. After the pallet has been oriented and positioned as desired, the lateral restraining members are moved into abutment against opposite lateral sides of the pallet support arm and secured in their respective positions thereat to maintain the set orientation and location of the pallet. When the pallet is removed, the lateral restraining members remain mounted stationarily to the underside of the pallet in their set positions so that upon remounting of the pallet to the support arm, the restraining members serve to orient and locate the pallet in the previously established position, thereby eliminating the need to reestablish the desired positioning of the pallet upon each subsequent reattachment to a pallet support arm. The pallet aligning system is particularly useful to remount a pallet in a centered position with respect to an image on a screen of a screen printing head used to print an image from edge-to-edge on a workpiece such as a T-shirt.

12 Claims, 8 Drawing Sheets

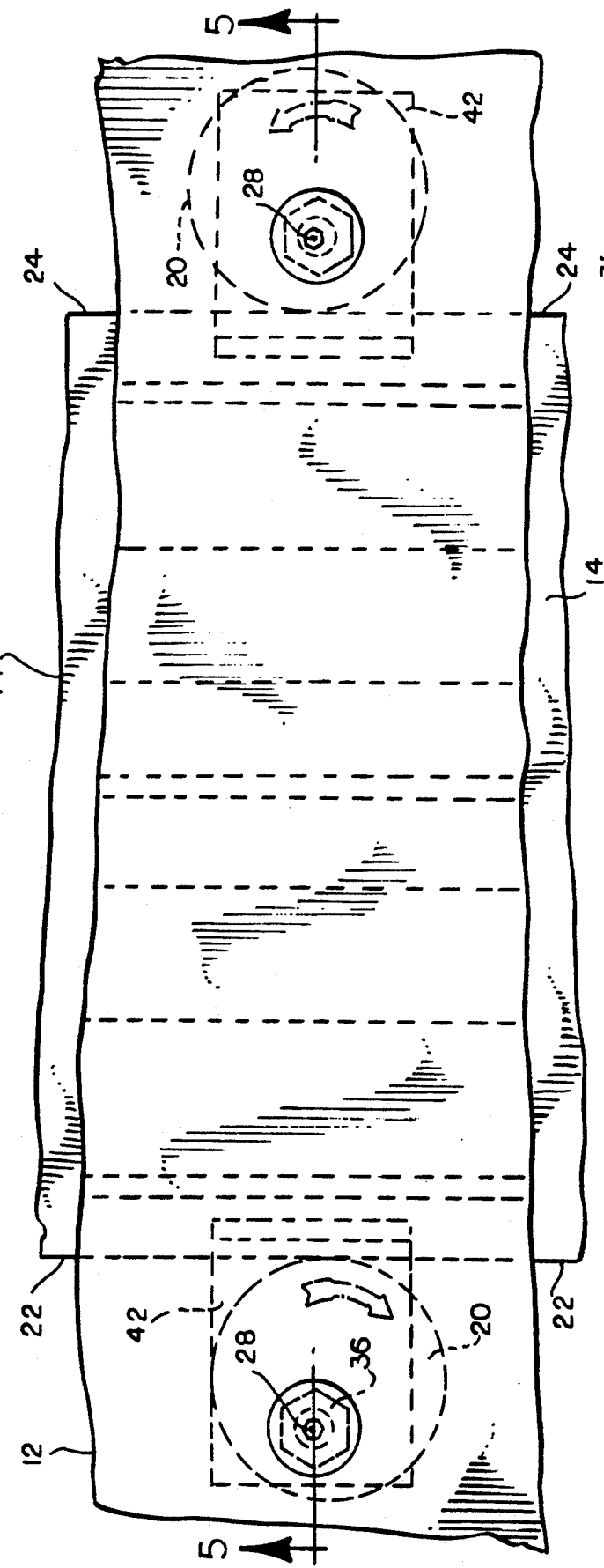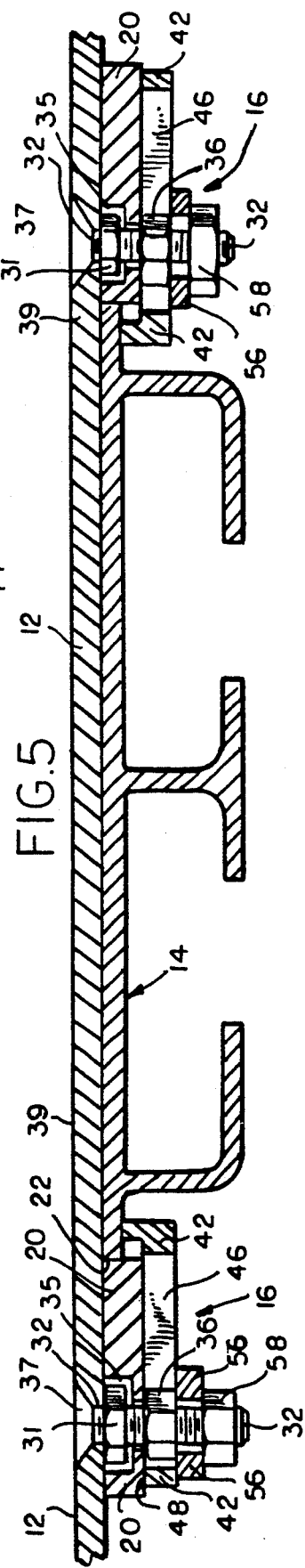

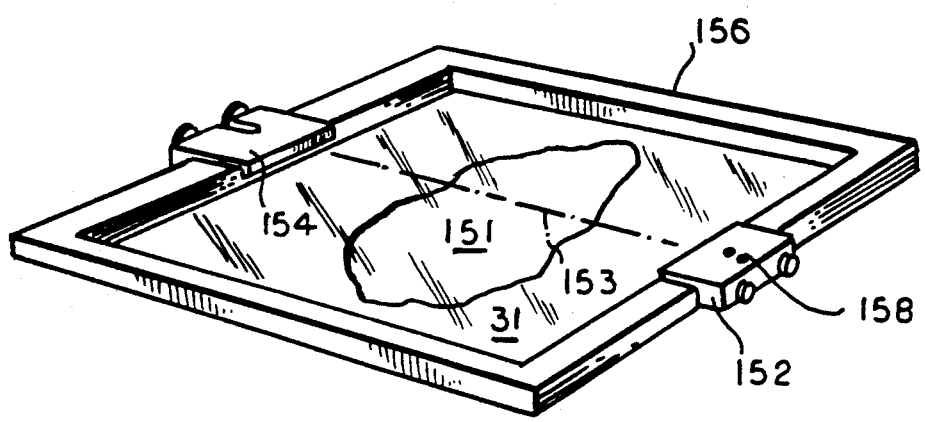
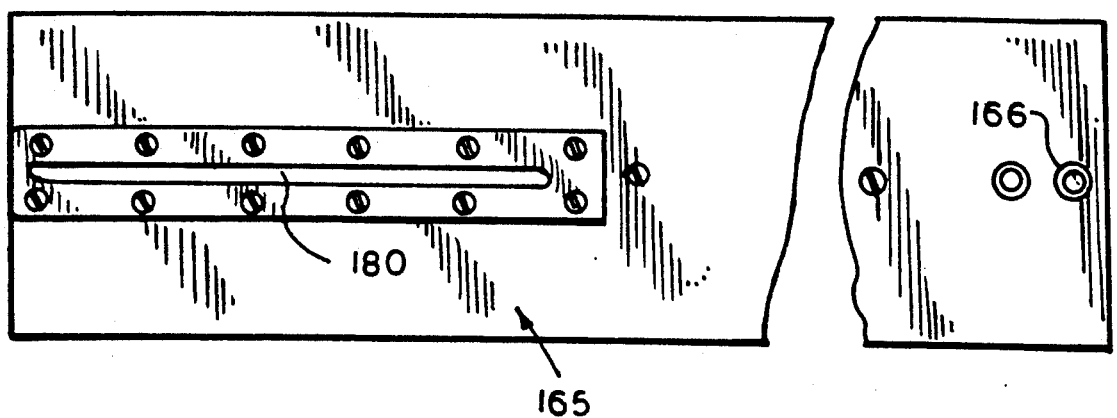

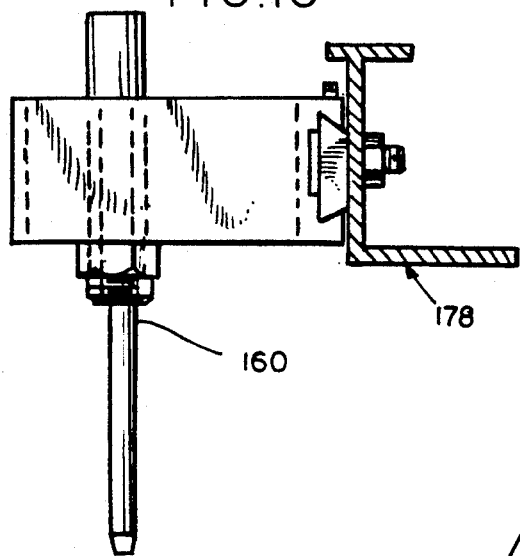
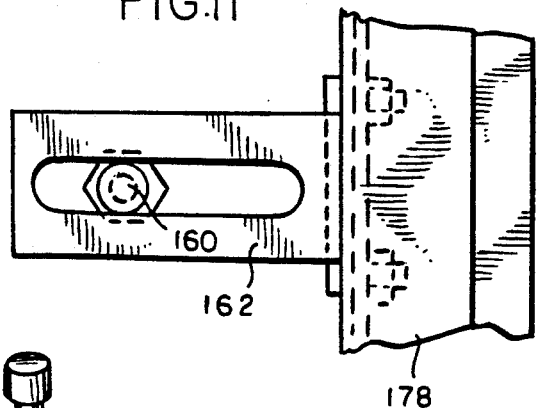
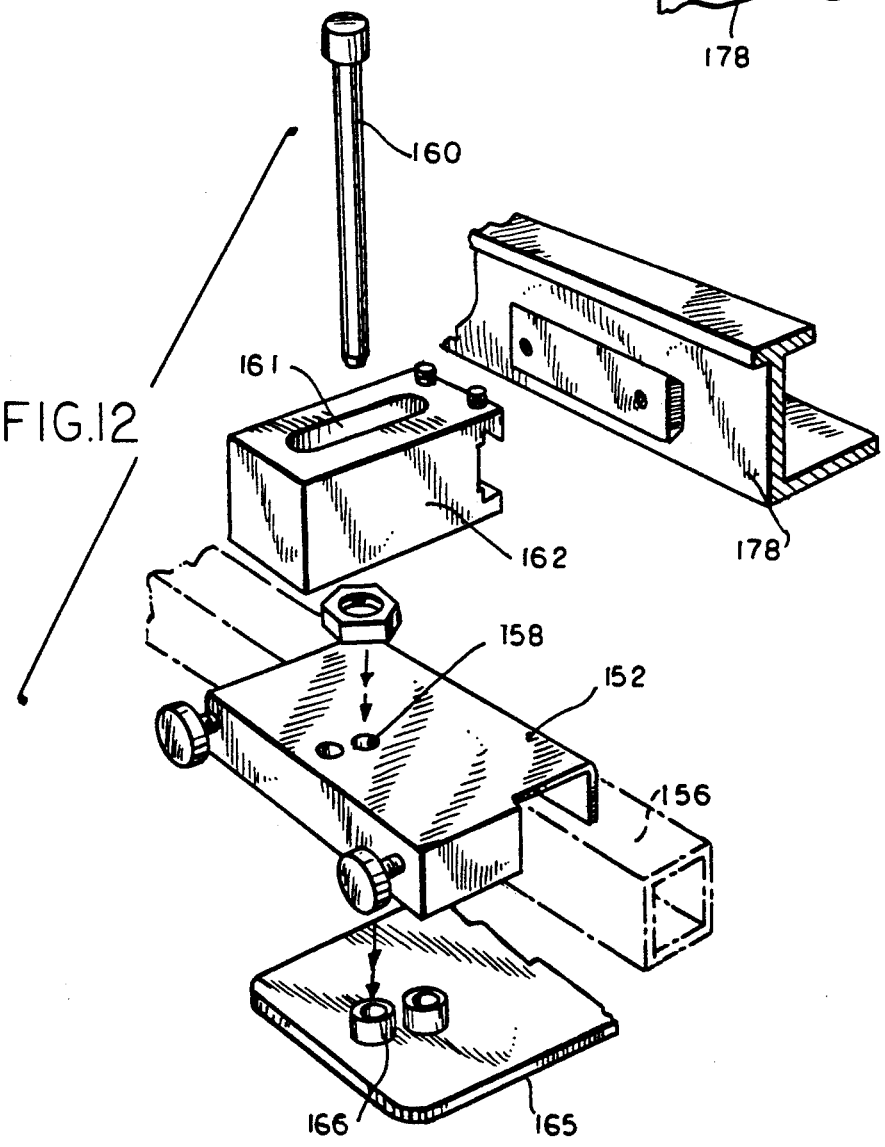

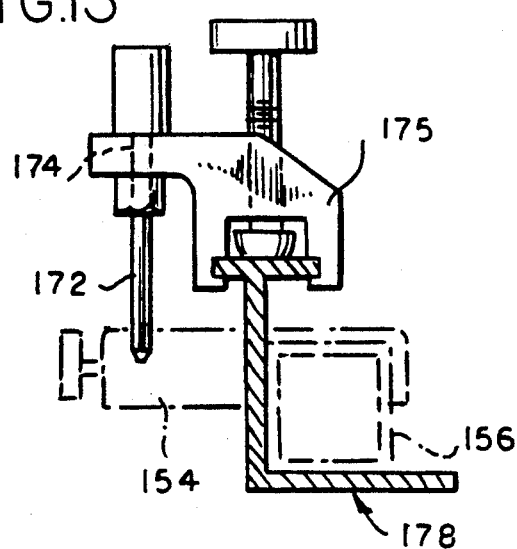
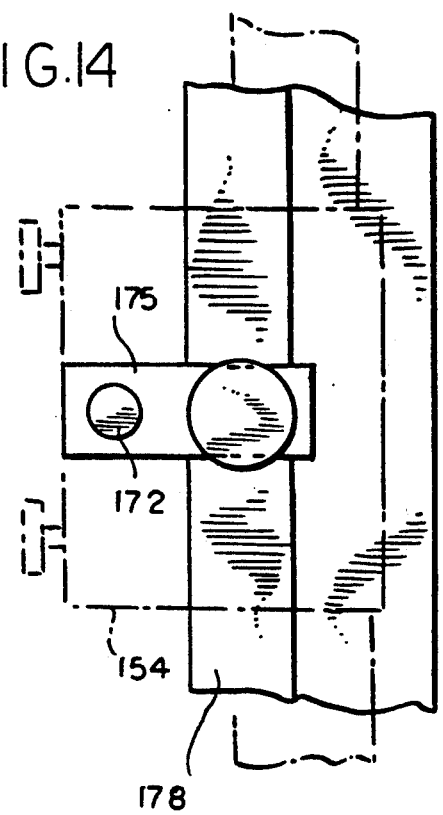
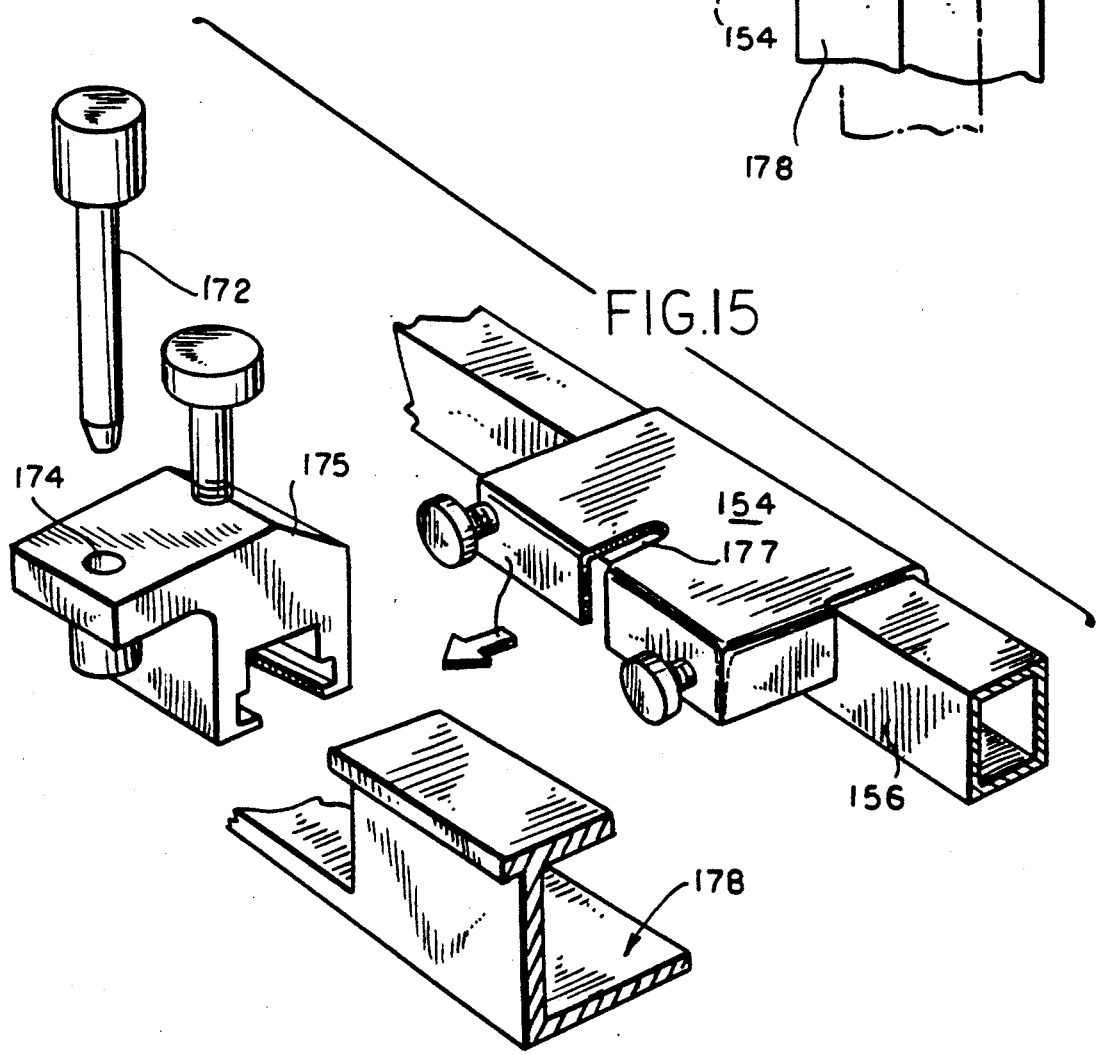

PALLET ALIGNMENT ASSEMBLY

CROSS-REFERENCE TO RELATED APPLICATIONS

This is a continuation-in-part of co-pending U.S. patent application Ser. No. 770,518, now U.S. Pat. No. 5,188,026, filed Oct. 3, 1991, entitled "Pin Register System For Screen Printers" and co-pending U.S. patent application Ser. No. 746,652, filed Apr. 16, 1991, entitled "Shirt Pallet With Retractable Arms" which are hereby incorporated by reference as if fully reproduced herein.

FIELD OF THE INVENTION

The present invention is directed to a system for attaching a pallet to a pallet supporting arm of a printing press in a predetermined orientation and position, and is directed to a screen and pallet attaching system which allows removal of the printing screens from their holders and removal of the pallets from their support arms and subsequent rapid repositioning of the printing screens and pallets in their previously registered positions.

BACKGROUND OF THE INVENTION

Conventional screen presses print multi-colored images on material by mounting the material to a pallet or platen and rotating the platen to each of a plurality of printing stations located peripherally about a central support, wherein a different color is printed on the material at each of the printing stations. The images printed at the several printing stations, when superimposed one over the other on the material, produce the desired multi-colored work.

For volume production of multiple printed copies, a plurality of platens are provided which are mounted for rotation about a central support column. The plurality of platens each have respective workpieces mounted thereon which are printed upon and advanced from station to station. It is also necessary that the object being printed be moved quickly from station to station in a multiple station printing apparatus, and necessary that the registration of the object to be printed with each of a succession of printing screens be maintained.

A variety of means have been developed for adjusting the location and orientation of screens on a screen printing press to allow the images produced thereby to be in accurate registration with one another. A particularly advantageous screen alignment system is that disclosed in co-pending U.S. patent application Ser. No. 770,518 now U.S. Pat. No. 5,188,026 entitled "Pin Registration System For Screen Printers." Therein, a registration table and pins are employed to accurately align images on each of the plurality of screens with respect to their associated screen frames. Then, each of the screen frames is mounted in a respective printing head with the alignment of the screens and images thereon being retained by use of a calibration pallet and registration pins to position each of the plurality of screens at an equal distance from both one another as well as from the central support column. Thus, by employing the "Pin Registration System For Screen Printers," the press will print each of the images of the various screens at the same orientation and spacing from the central support column, and therefore in accurate registration with one another.

When printing a number of objects such as T-shirts with the printed image being located generally centrally on the T-shirt, the platens holding the T-shirt are only generally located relative to the image on the printing screen. If the printed image is slightly off-center, the viewer will not usually notice that the printed image is off-center. However, it is often desirable to print "all over" or "to the edge" on a T-shirt, i.e., the image extending from one edge all across the T-shirt to the opposite edge, particularly across the arms of a T-shirt and to exactly the side edges of the T-shirt. In such case, the platens are carefully centered with respect to the image on the screen so that the printed image is centered on the T-shirt and does not leave an edge unprinted with printing being run off the other edge. An unprinted edge on a sleeve or along the body portion of a T-shirt, which is supposed to be printed completely across from one edge to the opposite edge, may result in the T-shirt becoming scrap. The alignment of the screens and the centered alignment of the platens relative to the images on the screens initially requires some skill on the part of the operator. A specialized platen or pallet for printing all over to the edges and onto the sleeves is disclosed in U.S. patent application Ser. No. 746,652, entitled "Shirt Pallet With Retractable Arms" which is hereby incorporated by reference as if fully reproduced herein.

Often, it is desired to make short runs, for example, printing a first run of T-shirts printed all over, followed by printing of a second run of other textiles using other screens and pallets, and then printing a third run of printed all over T-shirts using different colors but using the same images previously printed during the first run. Using conventional screen printing equipment, it would be necessary for a skilled person to register all of the printing screens, and then to adjust laboriously again the platens on their support arms to center again all of the platens beneath the respective screens to assure that the printing extends from edge to edge and is centered on the T-shirts without leaving one edge bare and unprinted. Such set-up time and the use of skilled labor to do the re-registration of the pallets and screens is time-consuming and costly.

Thus, there is a need for a system of reducing the set-up time associated with accurately remounting material-supporting pallets and/or screens in their previously registered positions relative to one another.

SUMMARY OF THE INVENTION

In accordance with the present invention, pallets may be positioned onto a pallet support arm and registered in a position, e.g., a centered position relative to the image on the screen, and then a pallet registering means may be abutted against the support and the pallets secured to the support. Later, the pallets may be removed; and at a later time, remounted on their associated support, with the pallet registering means abutting support to provide the same alignment and positioning characteristics as established initially without having the pallet being set up again as the pallet was initially. Also, the screen frames may be removed and marked with their previous printing station; and, remounted in the printing heads after intervening runs of other screens and pallets, with the pin registration system quickly aligning the screens in their previously registered positions in the respective printing heads. The pallets, which also have been marked as to their printing station, are remounted on the pallet supports with the registration means centering or otherwise locating each pallet with respect to its similarly marked printing screen. Thus, the pallet alignment system allows the pallet to be removed following its initially being accurately positioned and oriented, and remounted on a support arm with the pallet retaining the alignment and positioning characteristics imparted thereto during the aforementioned initial set-up. This eliminates the need to reorient and position each pallet for each subsequent reuse thereof. Once a pallet has been properly orientated and positioned on a pallet support arm, it can then be repeatedly removed and reattached to the pallet in the same orientation and lateral position with minimal set-up time. Thus, production rates are significantly increased, particularly in shorter run applications wherein pallets are more frequently interchanged.

To carry out the invention, a pallet is first placed atop a pallet supporting arm and then is centered with respect to the image on the screen so that the image is printed centrally and from edge-to-edge where the image is that extensive. Depending from the underside of the pallet are adjustable lateral restraining members, which are then moved into abutment against opposite lateral sides of the pallet support arm to prevent lateral movement of the pallet with respect to the pallet support arm. Thus, the lateral restraining members secure the desired centered orientation and lateral position with respect to the pallet support arm. The pallet is then clamped to the pallet support arm to fully prevent any movement of the pallet with respect to the pallet support arm during printing.

To change pallets, the pallet is unclamped from its support arm and slid forward or lifted upward off of the support arm with the restraining members remaining in their respective set positions on the underside of the pallet. Usually, the pallet will be marked to correspond to a given printing station and printing screen, e.g., 1, 2, 3, 4, etc.

A second pallet can be mounted on the pallet support arm and printed upon. When it is desired to re-use the first pallet on the first printing arm, the second pallet is removed and the first pallet, with its restraining members still secured in their established positions, is placed first on the pallet support arm. Receipt of the pallet support arm between the lateral restraining members orients and positions the pallet on the pallet support arm in the pre-established position. Thus, it is only necessary to then clamp the first pallet to the first pallet support arm to resume printing operations with the first pallet. The first screen will have been similarly marked as belonging to the first printing station; and it will be returned over the first marked pallet and using the pin and bracket alignment system, the first screen will be centered on the underlying first pallet and registered with the other screens.

In the preferred embodiment for carrying out the invention, four lateral restraining members depend from the underside of the pallet, two left and two right, with each of the members being independently positionable. After the pallet has been located on the pallet support arm in the desired orientation and location with respect to the central support column, two lateral restraining members are moved in abutment against the left side of the pallet support arm and secured thereat, and two lateral restraining members are moved into abutment with the right side of the pallet support arm and secured thereat, with the pallet thereby being secured to the pallet support arm in the desired orientation and lateral position.

That is, once the restraining members have been secured in place, thereby securing the pallet in the desired orientation and position, a channel is defined between the left side restraining members and the right side restraining members. The restraining members only restrain the pallet from lateral movement and, hence, the pallet is slidable forward within the defined channel off of the pallet support arm. The lateral restraining members remain in place following removal of the pallet from the pallet support arm, therefore allowing the pallet to be subsequently remounted onto the pallet support arm in the same orientation as set previously by simply sliding the pallet support arm into the previously oriented channel.

Hence, by providing each of the pallets employed in carrying out a particular style of run, e.g. T-shirt pallets, with the pallet alignment system of the present invention, it is not necessary to realign those pallets when reused in subsequent runs.

BRIEF DESCRIPTION OF THE DRAWINGS

In the drawings, wherein like elements are referenced alike:

FIG. 4 is a fragmentary plan view of a portion of a pallet alignment assembly embodying various features of the present invention;

FIG. 5 is fragmentary, cross-sectional view of the pallet alignment assembly taken along line 5—5 of FIG. 4;

FIG. 8 is a perspective view depicting a screen frame;

FIG. 9 is a fragmentary plan view of the calibration pallet;

FIG. 10 is an elevational view of a front alignment bracket;

FIG. 11 is a plan top view of the front alignment bracket depicted in FIG. 10;

FIG. 12 is an exploded perspective view depicting the association of the front aligning clamp, bracket, registration pin and calibration pallet;

FIG. 13 is an elevational view of a rear alignment bracket used in accordance with the present invention;

FIG. 14 is a plan top view of the rear alignment bracket shown in FIG. 13; and

FIG. 15 is an exploded perspective view depicting the association of the rear clamp, bracket and registration pin used in registering the rear of the screen frame.

DETAILED DESCRIPTION OF THE PREFERRED EMBODIMENTS

Figure 1:
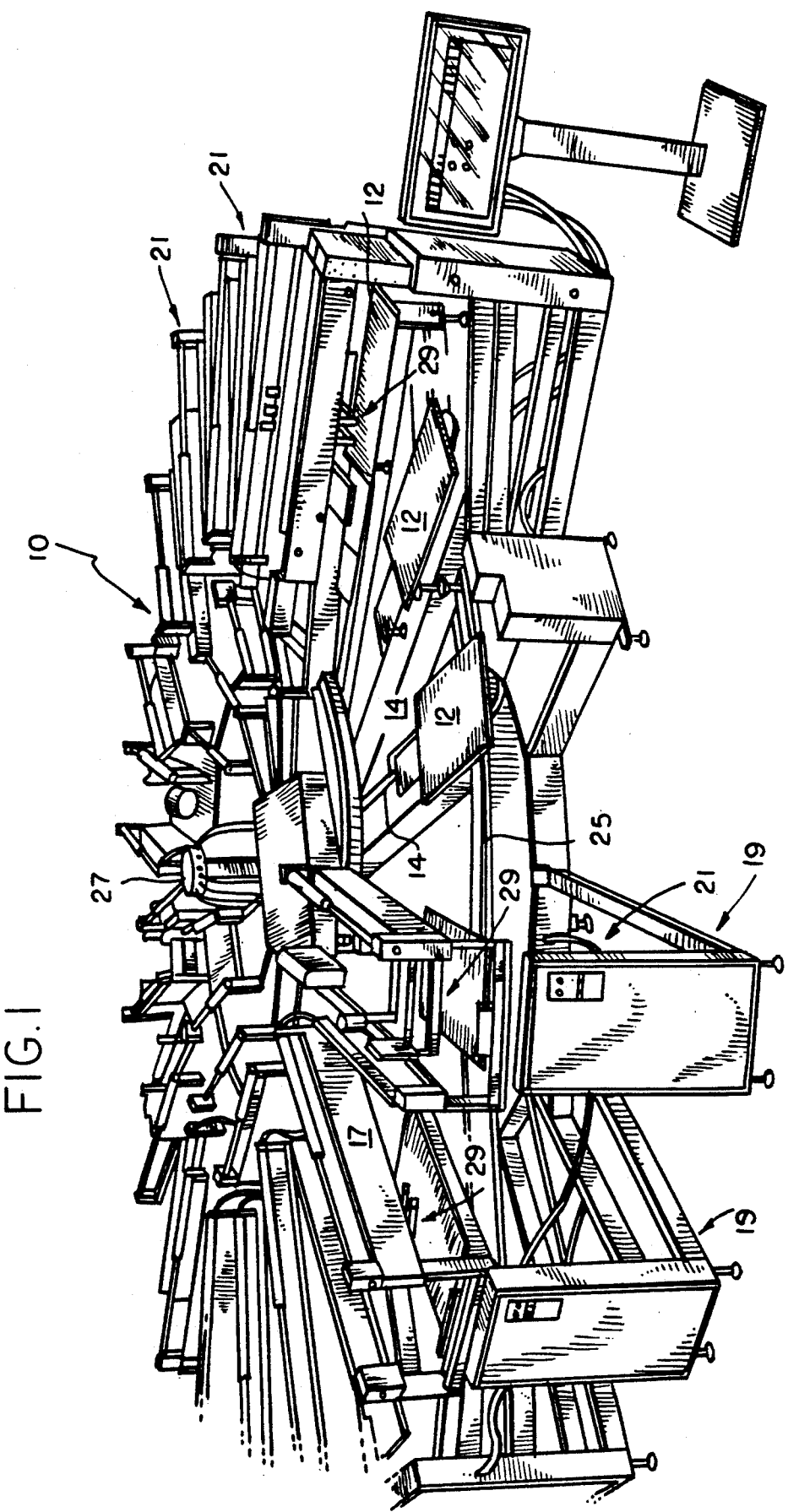
FIG. 1 is a perspective view of a screen printing press with a pallet embodying various features of the present invention mounted thereon.

FIG. 1 shows a screen printing press 10 having a pallet 12 mounted on a pallet support arm 14 thereof by employment of the pallet alignment assembly of the present invention, which assembly is referred to generally by reference numeral 16. The invention is described with reference to a specialized T-shirt pallet such as that shown in FIGS. 2 and 3, and described in detail in copending U.S. patent application Ser. No. 746,652 entitled "Shirt Pallet With Retractable Arms", although it will be readily appreciated that the alignment assembly of the present invention equally lends itself to employment with a wide variety of pallets.

The printing press 10 (FIG. 1) may take various forms; but for printing very large surface areas from edge-to-edge on the body of a T-shirt, and for printing out onto outer edges of the arms of the T-shirt, a very wide screen 31 (FIG. 8) and pallet 12 are used with the printing heads 17 each being mounted on a stationary support stand 19 located at a printing station 21 at a position radially outboard of the pallet 12. The pallets are carried on ends of supports in the form of arms 14 projecting radially outward from a rotating turret 25 which rotates about a vertical axis through a central support column 27. A squeegee and flood bar assembly 29 cooperate with a printing screen 31 (FIG. 8) to print on the top surface of a workpiece such as a T-shirt carried on each pallet 12. The pallets are indexed by indexing movement of the turret successively through the printing stations 21 with the T-shirt being centered beneath the image 151 on the printing screen. The pallets 12, in this instance, are supported from beneath when at a printing station, by a portion of the respective stands 19 to prevent deflection of the arms by the high pressure exerted on the ends of the long cantilevered pallet support arms 14 by the squeegee and flood bar.

Figure 2:
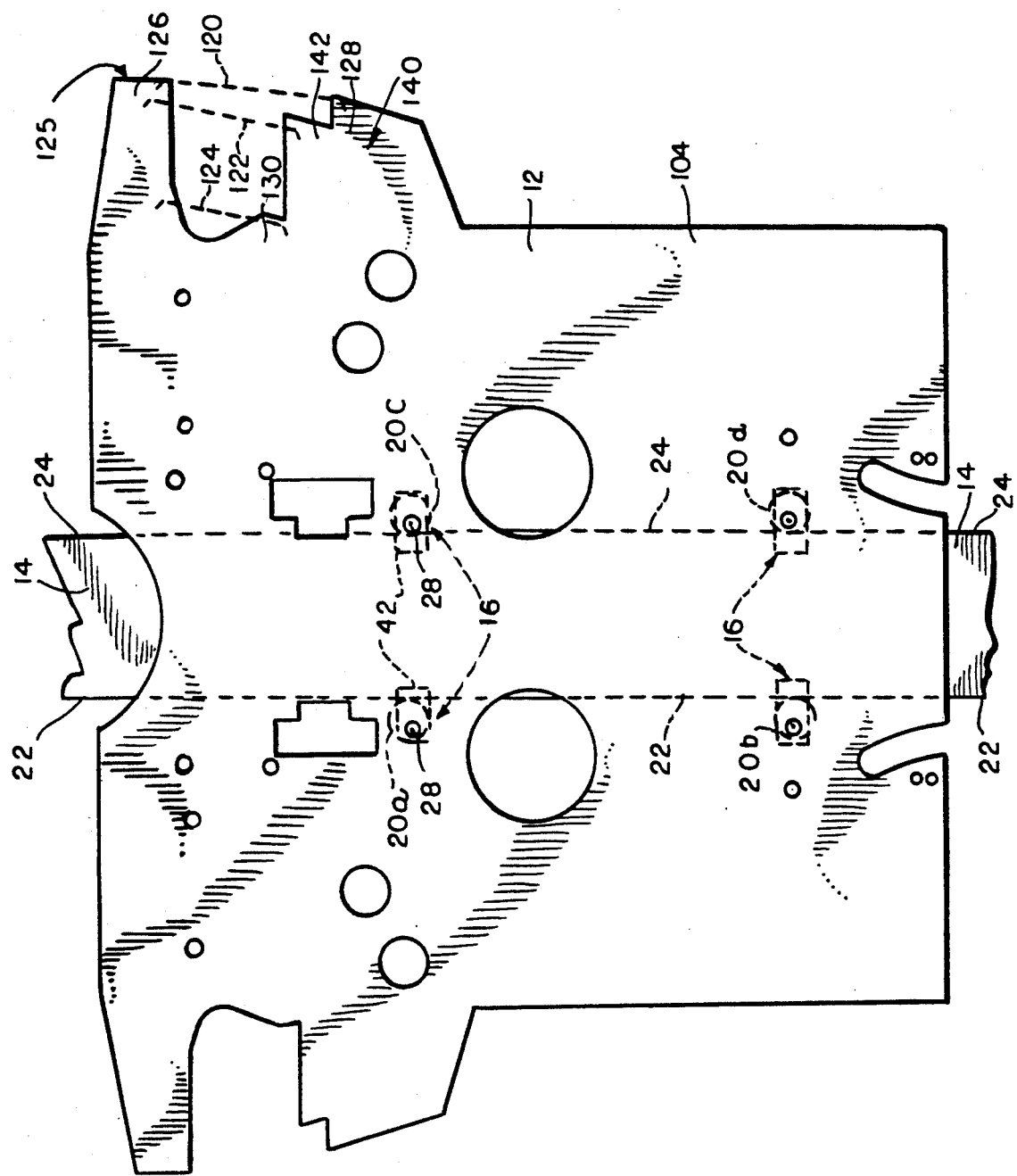
FIG. 2 is a plan view of a shirt supporting pallet embodying various features of the present invention.

With reference to FIG. 2, a pallet 12 is shown having four lateral restraining members 20a–d mounted on the underside thereof. Lateral restraining members 20a and 20b are shown abutting the left lateral side 22 of the pallet support arm 14, and lateral restraining members 20c and 20d are shown abutting the right lateral side 24 of the pallet support arm 14. Each of the lateral restraining members 20a–d comprises a circular lateral restraining member 20 pivotally mounted to the underside of the pallet 12 for rotation about an eccentric axis 28.

Figure 7:
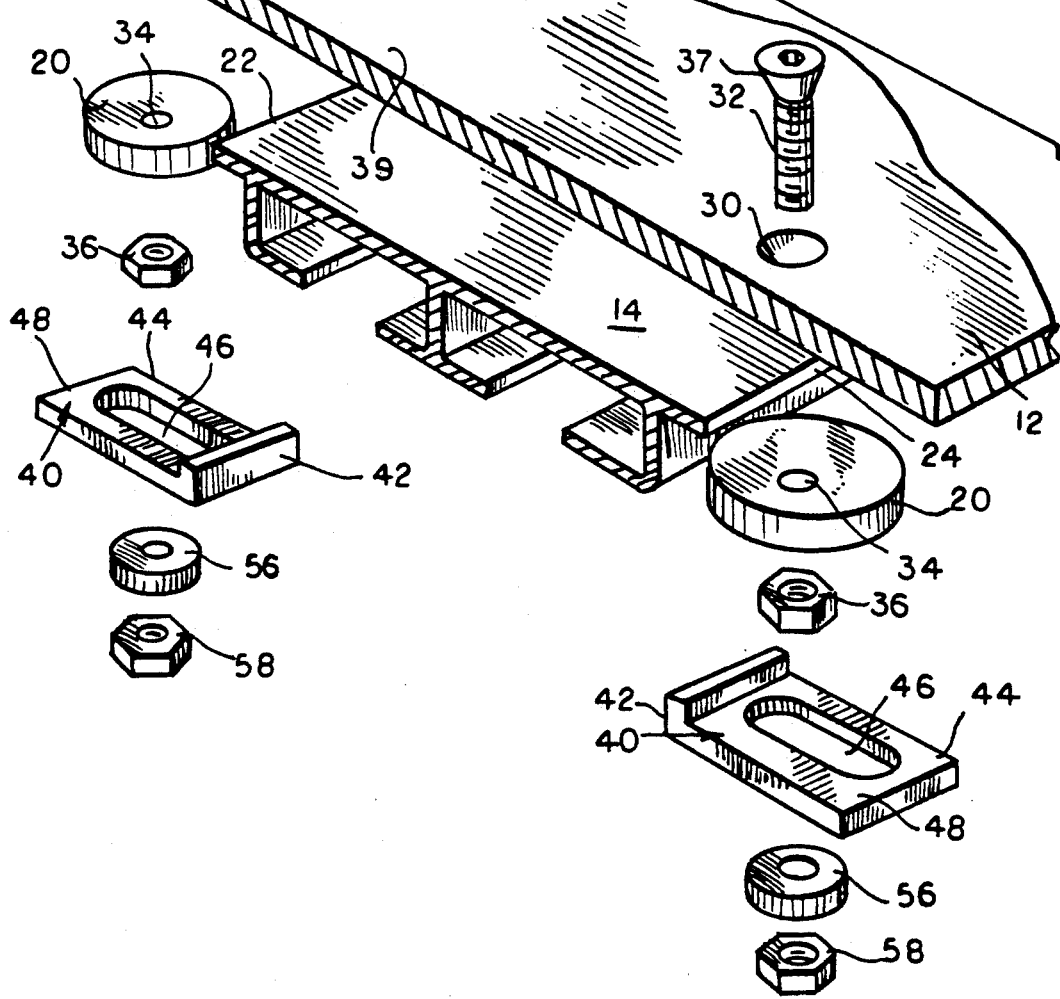
FIG. 7 is an exploded perspective view of the pallet alignment assembly of FIG. 4.

As seen in FIG. 7, the pallet 12 includes apertures 30 therein at the desired location for pivotal mounting of the lateral restraining members or disks 20a–d to the pallet 12. With brief reference again to FIG. 2, the preferred rectangular arrangement of the lateral restraining members 20a–d is shown, with lateral restraining members 20a and 20b being at the left corners of the rectangle, and lateral restraining members 20c and 20d being at the right corners of the rectangle. Hence, the apertures 30 are formed in the pallet 12 in corresponding positions.

Referring again to FIG. 7, screws 32 extend through each of the pallet apertures 30, extending through the lateral restraining member apertures 34 which is formed at an eccentric lateral restraining member pivot axis 28 (see FIG. 2). The mounting of the lateral restraining members 20 for pivotal rotation about the eccentric lateral restraining member axis 28 allows for variation of the location of the innermost the portions of each of the lateral restraining members 20, independent of the other lateral restraining members 20.

Hence, with brief reference to FIG. 4, the left lateral restraining member 20 is shown rotated to its rightmost position, and the right lateral restraining member is also shown rotated to its rightmost position. Since the abutment of the lateral restraining members 20 with the lateral sides 22 and 24 of the pallet support arm 14 defines the lateral position of the pallet 12 with respect to the support arm 14, the pallet 12 of FIG. 4 is thus located at its right most position with respect to the pallet support arm 14. Upon rotation of the lateral restraining members 20, their innermost surface is moved to the left. Hence, if both lateral restraining members 20 were rotated slightly, the pallet 12 would be positioned further to the left with respect to the pallet support arm 14 thereat. In this manner, the lateral position of the pallet with respect to the pallet support arm can be varied as desired independently at both the front and rear ends of the pallet. Thus, the angle or orientation of the pallet 12 with respect to the support arm 14 can be varied as desired by rotating the front pair of disks 20b and 20d to move their innermost surfaces one direction and rotating the rear pair of disks 20a and 20c to move their innermost surfaces in the opposite direction.

The amount of lateral variance of the innermost surface of each lateral restraining member 20 which is attainable using the aforementioned eccentric disk arrangement is defined by the distance of the eccentric lateral restraining member aperture 34 from the central axis of the lateral restraining member 20. The greater the eccentricity of the lateral restraining member aperture 34, and hence the pivot axis 28, the greater the amount of lateral variation of the innermost lateral restraining member surface. More specifically, with the eccentric disk pivoting arrangement shown in the drawings, the maximum amount of lateral variance of the innermost surface of a disk is two times the lateral distance between the actual first axis 28 and the central disk axis.

In carrying out the invention, the screws 32 are first passed through respective pallet apertures 30 and secured to the pallet 12 by securing nuts 31, which secure the screws 32 in a downwardly-depending position. (See FIG. 5). The lateral restraining members 20 are then loosely mounted to the pallet 12 by receiving the secured, downwardly-depending screws 34 in the eccentric lateral restraining member apertures 34, with the lateral restraining members 20 retained loosely mounted to the underside of the pallet 12 by screwing nuts 36 loosely onto the screws 32 during set up. The restraining members 20 have a recess 35 therein for accommodating the nut 31 to allow the restraining members 20 to lie flush against the underside of the pallet 12. The initial loose mounting of the lateral restraining members 20 allows the lateral restraining members to be easily rotated about their respective screws 32. The pallet 12 is then positioned on the pallet support arm 14 at the desired position and orientation. Usually the pallet 12 will be centered with respect to the image on the screen thereabove so that the image will be centered on the T-shirt when printed on the T-shirt while on the pallet. While the pallet 12 is held stationary at this position, the lateral restraining members 20 are rotated about their respective screws 23, and hence about their respective eccentric pivot axes 28, until all four of the lateral restraining members 20 abut respective lateral sides 22 and 24 of the pallet support arm 14. Thereafter, the lateral restraining members 20 are secured stationary at their respective pallet arm abutting positions by tightening of the respective nuts 36.

Accordingly, after tightening of the nuts 36, each of the lateral restraining members 20 is secured in a stationary position on the underside of the pallet 12 in abutment with a respective lateral side 22 and 24 of the pallet support arm 14. Hence, the pallet 12 is restrained from shifting laterally and also restrained from shifting its orientation with respect to the pallet support arm 14. The pallet apertures are chamfered so that the upper surface of the screw head 37 is flush with the upper surface 39 of the pallet 12 to provide a smooth printing surface.

The aforementioned preferred employment of four lateral restraining members 20a-d, as best seen in FIG. 2, allows for variation of the orientation of the pallet 12 as desired. The front two lateral restraining members 20 can be pivoted in one direction and the rear two lateral restraining members 20 independently pivoted in the other direction as required to bring all of the lateral restraining members 20 into abutment with the lateral sides 22 and 24 of the pallet support arm 14.

It is readily appreciated that although the invention is described with reference to four lateral restraining members in a rectangular configuration, other numbers and arrangements of restraining means may be employed without departing from the inventive concepts claimed herein. For instance, there may be one restraining member bearing against the left of the pallet support arm and two restraining members bearing against the right side.

After all of the lateral restraining members 20 have been secured in their respective stationary positions in abutment with respective lateral sides 22 and 24 of the pallet support arm 14, with the pallet 12 thereby prevented from shifting its orientation and lateral position, brackets 40 are employed to clamp the pallet 12 to the pallet support arm 14 so as to prevent forward and rearward movement of the pallet 12 with respect to the pallet support arm 14.

As best seen in FIG. 7, the brackets 40 are L-shaped members having a short leg 42 and a long leg 44 with an elongated slot 46 formed in the long leg 44. The width of the elongated slot 46 is made greater than the diameter of the corresponding nut 36 so that the upper surface 48 of the long leg 44 can be placed into abutment against the lower surface 50 of a respective lateral restraining member 20, with the nut 36 residing within the slot 46 and the screw 32 extending through the slot 46, as best shown in FIG. 5.

With the bracket 40 in this position, the upper surface 52 of the short leg 42 of the clamping bracket 40 is in abutment against the underside 54 of the support arm 14. By then placing a washer 56 of greater diameter than the width of the slot 46 onto the screw beneath the bracket 40, and subsequently tightly screwing a bracket nut 58 onto the screw 32, the upper surface 52 of the short clamp leg 42 is pressed tightly against the underside 54 of the pallet support arm 14 to secure the pallet 12 to the pallet support arm 14 in a stationary position. By employing such brackets 40 at each of the screws 32, and tightening all of the brackets 40, the pallet 12 will not shift with respect to its pallet support arm 14 during printing thereon.

When it is desired to change pallets 12, the clamp nuts 58 are unscrewed from their respective screws 32, the washers 56 slid off the screws 32, and finally the brackets 40 are slid off the screws 32. An important aspect of the lateral restraining and clamping design of the present invention is that the clamp nuts 58 can be unscrewed, and the brackets 40 removed, without affecting the lateral restraining members 20.

Thus, when all of the brackets 40 have been removed, the lateral restraining members 20 remain secured in their respective positions by the nuts 36. Thus, while removal of the brackets 40 now allows the pallet 12 to be slid forward and rearward, the lateral restraining members 20 retain the orientation and lateral positioning of the pallet 12 with respect to the support arm 14.

Thus, following removal of the brackets 40 from their respective screws 32, the pallet 12 is slidable forward or liftable upward off of the pallet support arm 14. The lateral restraining members 20 remain secured in their respective positions upon and following removal of the pallet 12 from the pallet support arm 14. Thereafter, another pallet 12 which may be either a conventional pallet or a pallet having alignment assembly of the present invention, may then be mounted to the pallet support arm 14.

Each of the pallets 12 will be marked by the operator with the station number on which it was originally aligned and its correspondingly numbered support arm so that upon reuse, the same pallet 12 may be returned to the same support arm 14. If a pallet were returned to a different support arm, it would lose the precisely centered registration it originally had because the arms are not exactly the same, and are not positioned exactly so that the pallet would be located beneath a different image on a different screen from its originally registered position. Preferably, the printing screens are all marked with their respective station numbers when the printing screens are removed for cleaning or washing when changing colors, and then subsequently returned to their printing arms 17 when the pallets are returned to their support arms 14.

When it is desired to remount a pallet 12 having been initially aligned, and therefore, which has its lateral restraining members 20 retained in their predetermined positions, the pallet can be remounted to the pallet support arm 14 by simply receiving the pallet support arm 14 between the left pair of lateral restraining members 20 and the right pair of lateral restraining members 20. Since the lateral restraining members 20 have already been moved and secured in the desired position previously to orient and laterally locate the pallet 12 as desired, the lateral restraining members 20 assure that the pallet 12 will be mounted to the pallet support arm 14 in the same orientation and lateral location as previously, without the need for any realignment.

Hence, alignment of the pallets 12 need only be carried out once. Thereafter, the lateral restraining members 20 remain in their respective positions so that when removed and subsequently remounted on the pallet support arm 14, the pallets 12 reattain their previously set orientation and lateral location on the pallet support arms 14. All that needs to be done to begin printing on the attached pallet 12 is to insert and tighten the brackets 40 to prevent forward and rearward movement of the pallet, and thus secure the pallet 12 in a stationary position on the pallet support arm 14.

As disclosed in co-pending U.S. patent application Ser. No. 770,518, filed Oct. 3, 1991, the printing screen 31 (FIG. 8) carries on a centerline 153 which is also centered on image 151 centered front and rear alignment clamps 152 and 154 mounted on the screen frame 156. Each of the screen frames has a pair of respective front and rear clamps (FIGS. 10, 11 and 12), all of which are respectfully centered with respect to the images 151 on their respective screens. The front clamp has a hole 158 therein on the centerline 153 for receiving a front registering pin 160 which passes through a slot 161 in a front registering bracket 162 and through the hole 158 in the front clamp and then through a hole 166 in a calibration pallet 165, which was used initially to align all of the screens. During the initial registration of the respective screens and images thereon, a single calibration pallet 165 was indexed from station-to-station to initially align the screen frames, as is described in detail in the aforesaid patent application. The calibration pallet is not used when remounting the screen frames or pallets 12 for reuse after the initial registration.

The rear of the screen frame 156 is similarly aligned by means of a rear registering pin 172 (FIGS. 13–15) dropped through a hole 174 in a rear bracket 175 clamped to the screen holder 178 on the printing arm and then through a slot 177 in the rear clamp fixed to the rear of the screen frame 156. Also, a rear registering pin 172 is dropped into a slot 180 in the calibration pallet 165 during the initial registration. This calibration pallet 165 is not used for relocating the screen frame for reuse. A rear registering pin 172 is used, however, to extend through hole 174 in the rear bracket 175 and a slot 177 in the rear clamp 154 to align the rear portion of the screen frame. The image on the screen frame, when remounted into the screen holder 178 on the printing arm, is registered by the pins 160 and 172 with its centerline 153 aligned with a radial line from the axis of the column 27 and to have its centerline 153 spaced at an even, arcuate multiple spacing with respect to all of the other printing screens. Thus, it will be seen that the brackets 162 and 175 serve as front and rear locator means on the printing head for cooperating with the front and rear clamps 152 and 154, which serve as front and rear locating means on the screen printing frames. These locating means on the screen frame and the printing head serve to re-establish the registered location of a screen image once the screen has been removed and re-installed at the same location. Because the pallet 12 has been previously centered on the image 151 on the screen, and because the eccentrics 20 retain the exact centered position for the pallet and a T-shirt thereon for edge-to-edge printing particularly across the sleeves, the pallet 12 may again be positioned on the pallet support arm 14 and clamped thereto by unskilled labor without the expense of a worked skilled in doing registration work and without the time-consuming re-registering operation in which no production is forthcoming.

Herein, the same base panel 104 may be used for a plurality of different sizes of T-shirts, e.g., large, medium and small. The description herein of the workpiece as being a T-shirt is for illustration purposes only. Manifestly, the workpiece could be any other textile or non-textile article; and the present invention is not limited to printing only on T-shirts.

Each of a plurality of different specialized pallets 12, each dedicated to printing of a particular type of garment, may be provided with the pallet alignment assembly of the present invention, so that the different specialized pallets can be readily interchanged to suit job demands with minimal setup time requirements. Thus, the pallet alignment assembly allows for increased production rates in applications in which the pallets 12 need to be changed.

Referring again to the aforementioned copending U.S. patent application Ser. No. 746,625 entitled "Shirt Pallet With Retractable Arms," which is discussed above as an illustrative example of a type of specialized pallet suitable for use with the pallet alignment assembly of the present invention, the shirt pallet will now be described in greater detail.

Figure 3:
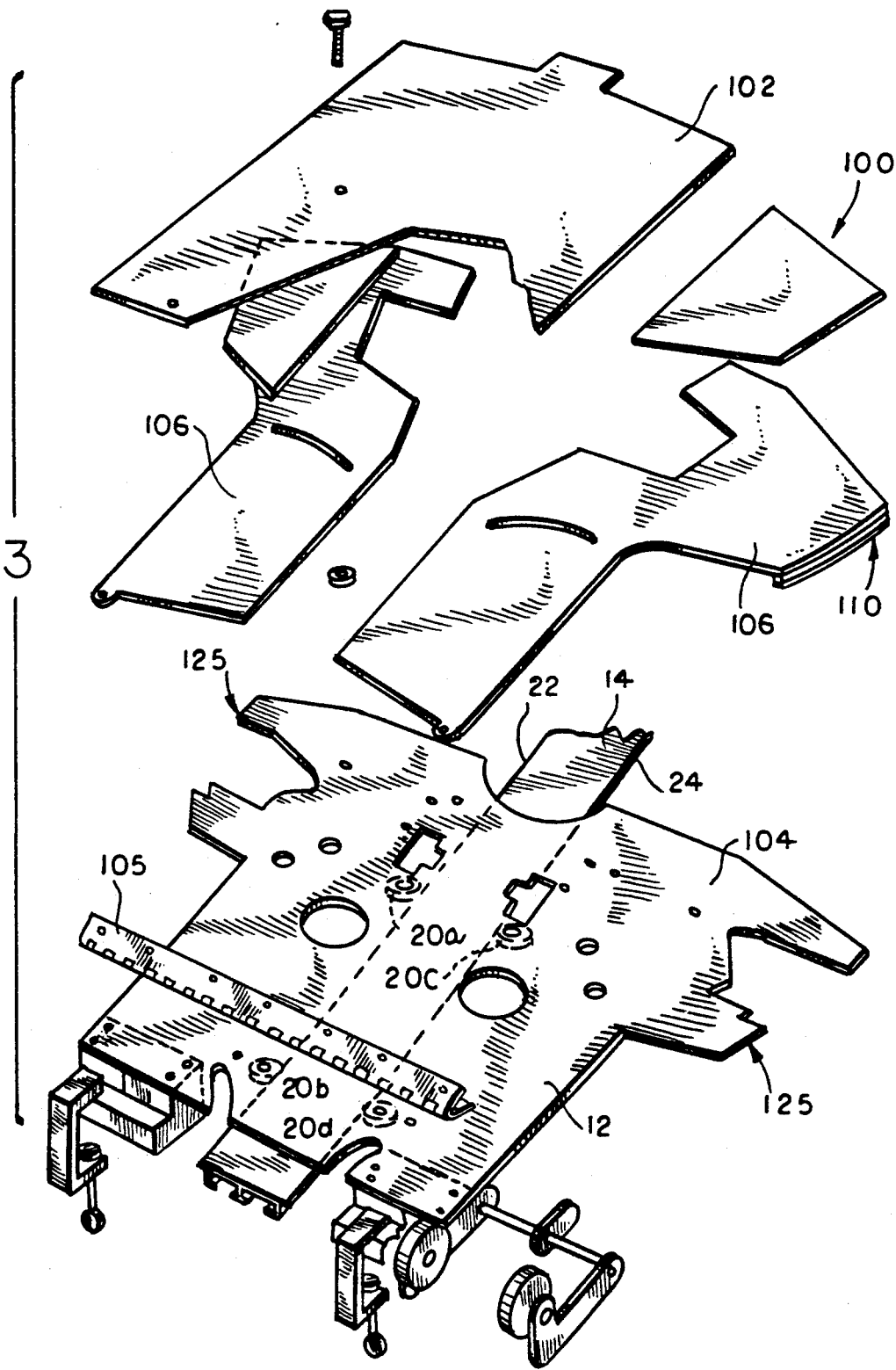
FIG. 3 is an exploded view of a shirt supporting pallet embodying various features of the present invention.
Figure 6:
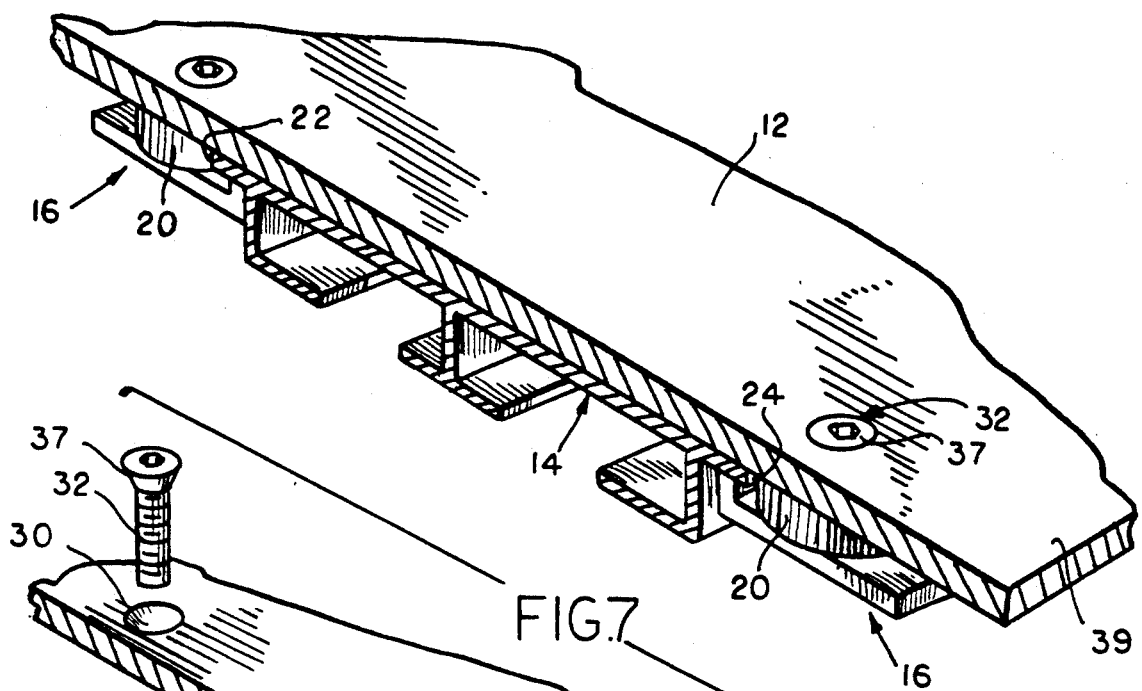
FIG. 6 is a fragmentary, perspective view of the pallet alignment assembly of FIG. 5.

A shirt pallet is shown in FIGS. 2 and 3 and referred to generally by reference numeral 100. With reference to FIG. 3, the pallet 100 comprises a thin upper or top panel 102 which is pivotally connected to a lower or bottom panel 104 through a hinge 105 to allow for pivotal movement of the upper panel 102 between a raised position in which the upper panel 102 is spaced upward from the lower panel 104, and a lowered position in which the upper panel 102 abuts the lower panel 104. The thinness of the upper panel 102 minimizes the amount of shirt material at its lateral sides so that a print can be made over the entire front surface of a shirt and another over the entire back surface of a shirt which prints will nearly meet.

The upper panel 102 has two sleeve panels 106 mounted thereto for pivotal movement between an inwardly retracted position and an outwardly extended position. A shirt to be printed is pulled taut over the upper panel 102 with the sleeve panels 106 in their inward retracted position. Then the sleeve panels 106 are pulled outward to their extended position into the sleeve of the shirt to pull the shirt sleeve taut, with the upper panel 102 still maintained in its raised position. This pulling outward of the sleeve panels 106 is carried out by an operator gripping the lip 110 of the sleeve panels 106 and pulling the sleeve panels 106 outward. Thereafter, the upper panel 102, with the sleeve panels 106 pivotally secured thereto, is lowered and rests on the lower panel 104, thereby securing the shirt between the upper and lower panels 102 and 104.

It is desirable for the operator to be able to maintain a grip on the sleeve panel lips 110 upon lowering of the upper panel 102 and sleeve panels 106 onto the lower panel 104. To allow for this, cutouts 112 are formed in the lower panel 104 at the location at which the lips 110 abut the lower panel 104, as shown in FIGS. 2 and 3.

Furthermore, it is desirable to utilize a single lower panel 104 while interchanging the upper panel 102 and sleeve panel 106 to accommodate different sized shirts. More specifically, it is desirable to employ pre-assembled upper panel 102, sleeve panel 106, and hinge 105 assemblies of different sizes which can be selectively interchanged upon the lower panel 104 to accommodate different sizes of shirts. For instance, there may be medium, large, and extra-large assemblies interchangeably used in combination with the common lower panel 104 depending upon the size of shirt to be supported for printing.

It is desirable for an operator to be able to maintain a grip on the lips 110 of the sleeve panels 106 during lowering thereof onto the lower panel 104. Hence, the aforementioned lower panel cutouts 112 must be able to accommodate the different sizes of upper panels 102 and sleeve panels 106 which are interchangeably used with the lower panel 104.

In order to assure a good print on the shirt sleeves, it is important that the ends of the sleeve panels 106, in the region near the lips 110, be supported during printing and not be allowed to flex downward. The stepped-down cutout configuration of FIGS. 2 and 3 provides for this.

With reference to the right side of FIG. 2, dotted lines represent an extra-large sleeve panel 120, large sleeve panel 122 and medium sleeve panel 124 in the position in which these differently sized panels abut the sleeve portion 125 of the lower panel 104. Generally the sleeve width as well as the length is different for the different sizes of shirts.

Thus, while it is possible to provide rectangular cutouts having a large constant width the same as the span between the upper sleeve portion 126 and the outer cutout tier 128, this would not provide the requisite support to the sleeve panels 106 during printing. That is, while the wide width is well suited for the extra-large sleeve panels 120 since they are wide enough that both the upper and lower ends thereof can rest, respectively, on the upper sleeve portion 126 and the outer cutout tier 128 as illustrated, the large sleeve panels 122 and medium sleeve panels 124 are too narrow to be supported at their lower ends. Hence, the large and medium sleeve panels 122 and 124 would not have sufficient support during printing and would flex.

Contrarily, while the cutouts can be made rectangular with a narrow constant width the same as that between the upper sleeve portion 126 and the inner cutout tier 130, this does not maximize the operator gripping space. It is desirable for the operator to have as large a gripping area as possible.

The three tier cutout arrangement illustrated in FIGS. 2 and 3 provides support to all three sizes of sleeve panels 120, 122 and 124, and also maximizes operator gripping space for gripping the lips 110 of the sleeve panels. The three tiers are formed in the lower sleeve portion 140, with the upper sleeve portion fairly linear. Outer cutout tier 128 is spaced a relatively large distance from the upper sleeve portion 126. The lower sleeve portion 140 then steps down to intermediate cutout tier 142 which is spaced closer to the upper sleeve portion 125 than the outer cutout tier 128. Finally, the lower sleeve portion 140 again steps down to inner cutout tier 130 which is spaced still closer to the upper sleeve portion 125.

Thus, the span between the upper sleeve portion 125 and the lower sleeve portion 140 is maximized for each size of sleeve panel 120, 122 and 124 to be interchangeably employed to allow maximum operator gripping space and still provide support of the sleeve panels 120, 122 and 124 at their upper and lower ends sufficient to withstand flexing thereof during printing.

While only specific embodiments of the invention have been described and shown, it is apparent that various alterations and modifications can be made therein. It is, therefore, the intention in the appended claims to cover all such modifications and alterations as may fall within the scope and spirit of the invention.

What is claimed is:

1. In a screen printing press, the combination comprising:
    a plurality of screen printing heads for printing on a workpiece;
    located means on the printing heads;
    screen printing frames having a screen with an image thereon for precise registration with images printed with other screens;
    locator means on each screen printing frame for cooperating with its associated locator means on its associated printing head to locate the screen images in a registered position for printing, the screen frame locator means restoring the screen frames in their respective registered positions upon each removal and subsequent reattachment of the screen frames to their respective printing heads;
    a plurality of pallet support arms moveable into registration with each of the printing heads;
    pallets for supporting a workpiece during printing thereon, removably mountable to respective support arms;
    said pallets being movable to a substantially centered position with respect to images on the screens to print close to edges of workpieces;
    adjustable alignment means on the pallet for movement into engagement with the support arms and being fixed with the pallet being substantially centered on the image on the screen, the alignment means restoring the pallets to their predetermined orientation and position on the support arm, in accurate registration with the registered position of the screen frames, upon each removal and subsequent reattachment of the pallets to their respective support arms, to accurately locate the print on the workpiece following reattachment of the pallets and screen frames to the printing press.

2. In a screen printing press, the combination comprising:
    a plurality of screen printing heads for printing on a workpiece;
    located means on the printing heads;
    screen printing frames having a screen with an image thereon for precise registration with images printed with other screens;
    locator means on each screen printing frame for cooperating with its associated locator means on its associated printing head to locate the screen images in a registered position for printing, the screen frame locator means restoring the screen frames in their respective registered positions upon each removal and subsequent reattachment of the screen frames to their respective printing heads;
    a plurality of pallet support arms moveable into registration with each of the printing heads;
    pallets for supporting a workpiece during printing thereon, removably mountable to respective support arms; and
    alignment means on the pallets for mounting the pallets on respective support arms in a predetermined orientation and spacing corresponding to said registered position of the screen frames, the alignment means restoring the pallets to their predetermined orientation and position on the support arm, in accurate registration with the registered position of the screen frames, upon each removal and subsequent reattachment of the pallets to their respective support arms, to accurately locate the print on the workpiece following reattachment of the pallets and screen frames to the printing press; and
    the alignment means on the pallets comprising a plurality of eccentrics mounted for turning into engagement with their support arms and fasteners to fasten the eccentrics in their engaged positions against opposite sides of their respective support arms.

3. A method for aligning a plurality of printing screens and a plurality of workpiece supporting pallets on a screen printing press in relation to one another to precisely register printed screen images with one another and accurately locate the printed images on the workpiece, the method comprising:
    mounting the plurality of printing screens, having an image thereon, with registration locating means on print heads of the printing press in relation to one another for printing the images of the screens in precise registration with one another; and mounting the plurality of workpiece supporting pallets to respective pallet supports of the printing press to align the pallets in an orientation and position corresponding to the registered position of the printing screens to accurately locate the print on the workpiece in a desired orientation and position;

marking the pallets with indicia to identify the pallets with the pallet supports upon which they were aligned;

marking the printing screens with indicia to identify the printing screens with the print heads in which they were mounted;

removing the pallets from the pallet supports and removing the printing screens from the printing heads;

securing alignment means on each of the pallets in position abutting the respective pallet supports; and reattaching the printing screens and the pallets to their respective marked locations with the locator means on the printing screens and printing heads re-registering the printing screens and with the alignment means on the pallets re-aligning each pallet in its previously registered position on its support.

4. The method of claim 3 in which the step of securing alignment on the pallets includes rotating eccentrics on opposite sides of the pallet support into abutment with opposite sides of the pallet support, and tightening fasteners to secure the eccentrics in their abutted position.

5. In a screen printing press, a pallet assembly for detachably mounting to a pallet support arm, having locating surfaces thereon and on a screen printing press, in a precisely aligned orientation and predetermined position on the pallet support arm, the pallet assembly comprising:

a base having a lower surface for resting on the pallet arm to be supported thereby during printing, first positioning locator means on the underside of the pallet base movable to a first positioning location to engage locating surfaces on one side of the pallet support arm, second positioning locator means on the underside of the pallet base spaced from the first positioning locator means, and adjustably movable relative to the base into position to engage locating surfaces on another side of the pallet support arm after the pallet has been precisely aligned, locking means operable to lock the second positioning locating means in its respective adjusted position after the pallet has been aligned, and releasable securing means operable in a first position to secure the pallet to the support arm with the second positioning locator means locked in engagement with the locating surfaces on the pallet support arm; the releasable securing means being movable to a release position to allow removal of the pallet from the support arm and return of the pallet with the first and second positioning locator means remaining in their previous positions to restore the pallet to its previously-aligned orientation and predetermined position on the support arm prior to re-securing the pallet by the releasable securing means.

6. A pallet assembly in accordance with claim 5 in which the first locator positioning means is also adjustable and movable relative to the base plate, and is locked by the locking means in an adjusted position.

7. A pallet assembly in accordance with claim 5 in which the first and second locator positioning means are eccentrics movable about respective axes of rotation.

8. A pallet assembly in accordance with claim 7 in which the releasable securing means comprises clamps mounted co-axially with each of the respective axes for the eccentrics.

9. A pallet assembly, comprising:

a base having a lower surface for resting on the pallet arm to be supported thereby during printing, first positioning locator means on the underside of the pallet base movable to a first positioning location to engage locating surfaces on one side of the pallet support arm, second positioning locator means on the underside of the pallet base spaced from the first positioning locator means, and adjustably movable relative to the base into position to engage locating surfaces on another side of the pallet support arm after the pallet has been precisely aligned, locking means operable to lock the second positioning locating means in its respective adjusted position after the pallet has been aligned, and releasable securing means operable in a first position to secure the pallet to the support arm with the second positioning locator means locked in engagement with the locating surfaces on the pallet support arm; the releasable securing means being movable to a release position to allow removal of the pallet from the support arm and return of the pallet with the first and second positioning locator means remaining in their previous positions to restore the pallet to its previously-aligned orientation and predetermined position on the support arm prior to re-securing the pallet by the releasable securing means.

10. A method of locating a removable pallet on a pallet supporting arm of a rotatable printing press having a plurality of screen printing heads and a plurality of pallet support arms for carrying a pallet to support a workpiece while being printed, said method comprising the steps of:

rotating a pallet arm beneath a screen printing head and shifting a pallet on the arm into a registered position beneath the screen and printing an image thereon;

shifting the pallet on the support arm to position the pallet precisely relative to the printing screen;

providing eccentrics on the pallet for cooperating with locating surfaces on the support arms;

turning the eccentrics to locating positions in abutment with the locating surfaces on the arm, and securing the eccentrics in the locating positions while against the locating surfaces;

fastening the pallet to the pallet arm in the locating position;

printing with the pallet in its registered position;

removing the pallet for replacement by a second pallet; and replacing the second pallet with the first pallet leaving the eccentrics in their previously-adjusted positions and abutting the eccentrics against the locating surfaces on the arm to re-establish the same previous registration for the pallet.

11. A method of locating the pallet in accordance with claim 10 in which the step of fastening the pallet to the pallet support arm includes the use of fasteners to tighten the clamps mounted co-axially with the eccentrics, and in clamping engagement with the pallet adjacent the locations of the eccentrics.

12. A method in accordance with claim 10 in which four eccentrics are mounted on the bottom of the pallet, and in which the arm comprises an upper, flat, horizontal surface with depending sidewalls as the locating surfaces, and including the steps of sliding the pallet on the top flat surface of the pallet support arm with the eccentrics sliding along the depending locating surfaces.

* * * * *

UNITED STATES PATENT AND TRADEMARK OFFICE
CERTIFICATE OF CORRECTION

PATENT NO. : 5,226,362

DATED : July 13, 1993

INVENTOR(S) : Iaccino, et al.

It is certified that error appears in the above-identified patent and that said Letters Patent is hereby corrected as shown below:

ON THE TITLE PAGE: Item [56]

After "4,939,991 7/1990 Szarka" insert --4,949,635 8/1990 Padula--.

Column 4, line 18, after "e.g." insert --,-- (comma).

Column 4, line 36, after "is" insert --a--.

Column 4, line 40, after "5;" delete "and".

Column 4, line 42, change "4." to --4;--.

Column 5, line 44, after "lateral" delete "35".

Column 5, line 53, change "is" to --are--.

Column 5, line 58, after "innermost" delete "the".

Column 9, line 42, change "worked" to --worker--.

IN THE CLAIMS:

Column 11, line 55, change "located" to --locator--.

UNITED STATES PATENT AND TRADEMARK OFFICE
CERTIFICATE OF CORRECTION

PATENT NO. : 5,226,362

DATED : July 13, 1993

INVENTOR(S) : Iaccino, et al.

It is certified that error appears in the above-identified patent and that said Letters Patent is hereby corrected as shown below:

IN THE CLAIMS:

Column 12, line 39, after "arms;" delete "and".

Column 12, line 68, after "another;" delete "and".

Signed and Sealed this

Twelfth Day of April, 1994

BRUCE LEHMAN

*Commissioner of Patents and Trademarks*

*Attest:*

*Attesting Officer*